(12) United States Patent
Omura et al.

(10) Patent No.: US 8,460,997 B2
(45) Date of Patent: Jun. 11, 2013

(54) SEMICONDUCTOR MEMORY DEVICE AND METHOD OF MANUFACTURING THE SAME

(75) Inventors: Mitsuhiro Omura, Kawasaki (JP);
Satoshi Nagashima, Yokohama (JP);
Katsunori Yahashi, Yokohama (JP);
Jungo Inaba, Yokkaichi (JP); Daina Inoue, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 345 days.

(21) Appl. No.: 12/929,125

(22) Filed: Jan. 3, 2011

(65) Prior Publication Data
US 2011/0097888 A1    Apr. 28, 2011

Related U.S. Application Data

(62) Division of application No. 12/244,523, filed on Oct. 2, 2008, now abandoned.

(30) Foreign Application Priority Data

Oct. 3, 2007    (JP) .................................. 2007-260039

(51) Int. Cl.
*H01L 21/302*    (2006.01)
(52) U.S. Cl.
USPC .......................................... 438/257; 438/197
(58) Field of Classification Search
USPC .................. 257/315, 316; 438/197, 257–259, 438/297, 717, 725, 736–738, 671, 89, 700, 438/702, 703, 946, 947
See application file for complete search history.

(56) References Cited

U.S. PATENT DOCUMENTS

| | | | |
|---|---|---|---|
| 6,835,978 B2 | 12/2004 | Matsui et al. | |
| 7,390,746 B2 * | 6/2008 | Bai et al. | 438/689 |
| 2007/0176224 A1 | 8/2007 | Yaegashi | |
| 2007/0275519 A1 | 11/2007 | Choi | |
| 2008/0185630 A1 | 8/2008 | Aoyama et al. | |

FOREIGN PATENT DOCUMENTS

| | | |
|---|---|---|
| JP | 2005-228868 | 8/2005 |
| KR | 10-0760634 B1 | 9/2007 |

OTHER PUBLICATIONS

Notice Concerning Filing of Arguments issued by the Korean Patent Office on Jun. 29, 2010, for Korean Patent Application No. 10-2008-97010, and English-language translation thereof.
English machine translation of Park et al., KR 10-0760634.

* cited by examiner

*Primary Examiner* — Matthew Landau
*Assistant Examiner* — Candice Chan
(74) *Attorney, Agent, or Firm* — Finnegan, Henderson, Farabow, Garrett & Dunner, L.L.P.

(57) ABSTRACT

A semiconductor memory device comprises a plurality of transistors having a stacked-gate structure. Each transistor includes a semiconductor substrate, a gate insulator formed on the semiconductor substrate, a lower gate formed on the semiconductor substrate with the gate insulator interposed, an intergate insulator formed on the lower gate, and an upper gate formed and silicided on the lower gate with the intergate insulator interposed. A portion of the transistors has an aperture formed through the intergate insulator to connect the lower gate with the upper gate and further includes a block film composed of an insulator and formed smaller than the upper gate and larger than the aperture above the upper gate to cover the aperture.

6 Claims, 8 Drawing Sheets

SEMICONDUCTOR MEMORY DEVICE AND METHOD OF MANUFACTURING THE SAME

CROSS-REFERENCE TO RELATED APPLICATION

This application is a division of application Ser. No. 12/244,523, filed Oct. 2, 2008 now abandoned, is based on and claims the benefit of priority from prior Japanese Patent Application No. 2007-260039, filed on Oct. 3, 2007, the entire contents of both of which are incorporated herein by reference.

BACKGROUND OF THE INVENTION

1. Field of the Invention

The present invention relates to a semiconductor memory device and method of manufacturing the same, and more particularly to a structure of a stacked-gate nonvolatile semiconductor memory and method of manufacturing the same.

2. Description of the Related Art

A NAND-type flash memory is well known as one of nonvolatile semiconductor memories. Such the NAND-type flash memory comprises a semiconductor substrate on which memory cells and selection transistors are formed together with peripheral circuits required for memory operation. A memory cell may include a floating gate composed of conductive polysilicon formed on the semiconductor substrate with a gate insulator interposed, and a control gate composed of conductive polysilicon formed on the floating gate with an intergate insulator interposed.

On the other hand, the selection transistors and the transistors in the peripheral circuits are formed through process steps in accordance with formation of the memory cells. The transistors may include a lower gate composed of conductive polysilicon formed on the semiconductor substrate with the gate insulator interposed, and an upper gate composed of conductive polysilicon formed thereon with an insulator interposed.

In this way, the NAND-type flash memory comprises a stacked-gate nonvolatile semiconductor memory having a plurality of gates stacked with insulators interposed.

As for the selection transistors and the transistors in the peripheral circuits, it is required to cause an electrical short circuit between the upper gate and the lower gate in accordance with formation of memory cells such that they can serve as transistors. The electrical short circuit maybe caused with an aperture formed through part of the intergate insulator between the upper gate and the lower gate.

If the transistor has a gate length of 50 nm or below on the other hand, the gate resistance increases and causes problems associated with lack of the voltage applied to the gate and the signal speed delay. These problems may be solved by a full silicide structure including the entire gate silicided as proposed (see, for example, JP 2005-228868A).

Such the full silicide structure may be applied to the above-described stacked-gate nonvolatile semiconductor memory. In this case, together with fully siliciding the control gate, the upper gate of the selection transistor is also fully silicided. When the upper gate is fully silicided, metal atoms can diffuse into the lower gate via the aperture formed through the insulator between the upper gate and the lower gate, thereby siliciding part of the lower gate electrode as well.

If the lower gate electrode is progressively silicided to the gate insulator, the silicide contacts the gate insulator in some portions and the conductive polysilicon touches the gate insulator in other portions in mixture in the structure close to the gate insulator.

In that case, the operating characteristics of the transistor, such as the threshold of the selection transistor, may vary and make it difficult to keep stable transistor operation.

SUMMARY OF THE INVENTION

In an aspect the present invention provides a semiconductor memory device, comprising a plurality of transistors having a stacked-gate structure, each transistor including; a semiconductor substrate, a gate insulator formed on the semiconductor substrate, a lower gate formed on the semiconductor substrate with the gate insulator interposed, an intergate insulator formed on the lower gate, and an upper gate formed and silicided on the lower gate with the intergate insulator interposed, a portion of the transistors having an aperture formed through the intergate insulator to connect the lower gate with the upper gate and further including a block film composed of an insulator and formed smaller than the upper gate and larger than the aperture above the upper gate to cover the aperture.

In another aspect the present invention provides a semiconductor memory device, comprising: a plurality of memory cells, each including; a semiconductor substrate, a gate insulator formed on the semiconductor substrate, a lower gate serving as a floating gate formed on the semiconductor substrate with the gate insulator interposed, an intergate insulator formed on the lower gate, and an upper gate serving as a control gate formed and silicided on the lower gate with the intergate insulator interposed; and a plurality of transistors formed together with the memory cells, each transistor including; the semiconductor substrate, the gate insulator, the lower gate, the intergate insulator, and the upper gate, the transistor having an aperture formed through the intergate insulator to connect the lower gate with the upper gate and further including a block film composed of an insulator and formed smaller than the upper gate and larger than the aperture above the upper gate to cover the aperture.

In another aspect the present invention provides a method of manufacturing a semiconductor memory device, comprising: forming a gate insulator on a semiconductor substrate; forming a first conductive film on the gate insulator; forming an intergate insulator on the first conductive film; selectively forming an aperture by etching through the intergate insulator in part of a region for use in formation of a transistor; forming a second conductive film on the intergate insulator; forming a first insulator above the second conductive film; forming a block film larger than the aperture to cover the aperture by selectively removing part of the first insulator; forming a sidewall composed of a second insulator on the sides of the block film and forming a gate pattern composed of the second insulator in a region for use in formation of control gates of memory cells; selectively removing the second conductive film, the intergate insulator and the first conductive film by etching with a mask of the block film, the sidewall and the gate pattern to form gates of the memory cell and the transistor; burying a third insulator around the formed gates; removing the second insulator after burying the third insulator; and siliciding the second conductive film by depositing a siliciding metal on an upper surface of a portion of the gates of the memory cell and the transistor from which the second insulator has been removed.

DETAILED DESCRIPTION OF THE EMBODIMENTS

Embodiment of Device Structure

A semiconductor memory device according to an embodiment of the present invention will now be described with reference to the drawings.

Figure 1:
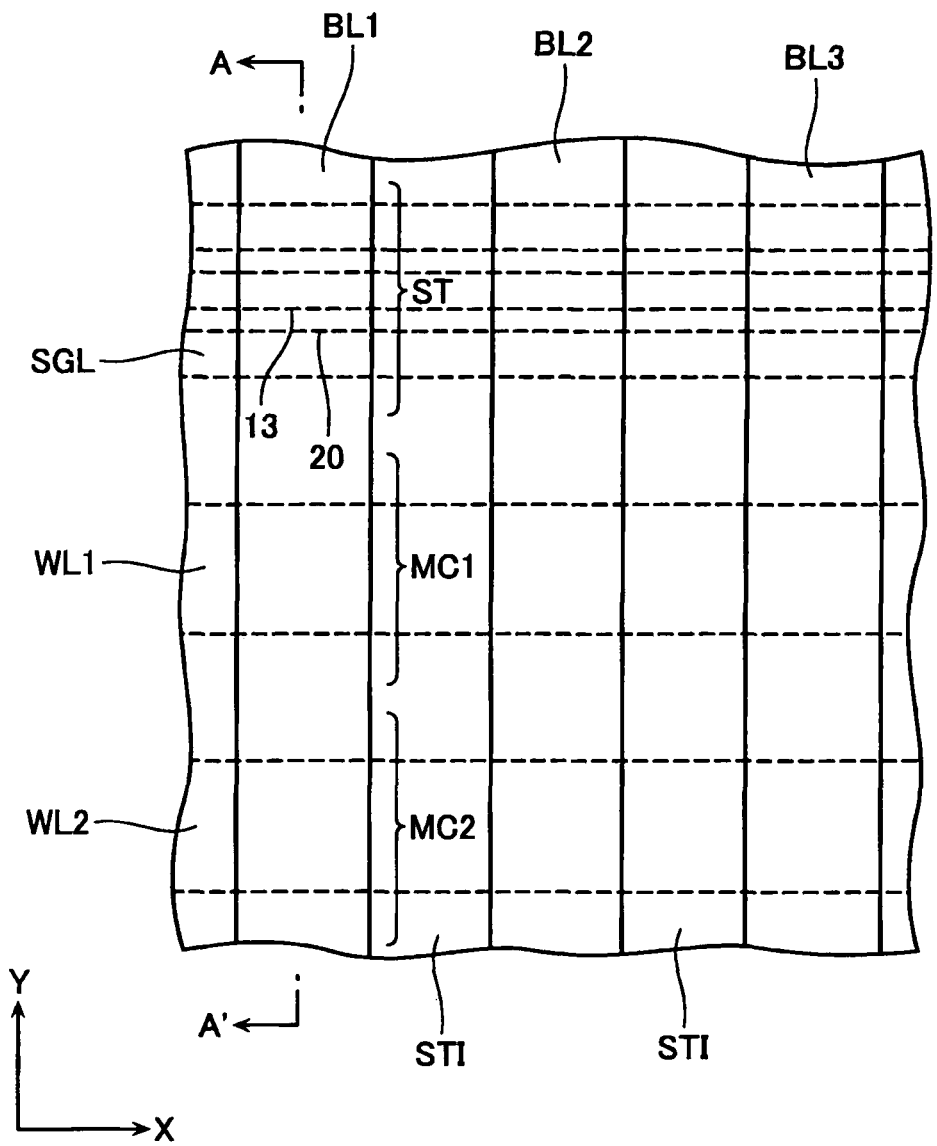
FIG. 1 is a plan view of a memory cell array in a NAND flash memory according to an embodiment of the present invention.

FIG. 1 is a plan view of a cell area in a NAND flash memory according to the embodiment of the present invention.

The cell area includes a plurality of bit lines BL (BL1, BL2, BL3, . . . ) extending in the Y-direction in the figure formed therein. Formed in a lower layer than these bit lines BL are a selection gate SGL and a plurality of word lines WL (WL1, WL2, . . . ) extending in the X-direction at right angles to the bit lines BL.

Each memory cells MC is formed below an intersection of the word line WL and the bit line BL and a plurality of such memory cells MC (MC1, MC2, . . . ) are serially connected along the bit line BL direction. Selection transistors ST are formed below an intersection of the selection gates SGL and the bit line BL and connected to both ends of the serially connected memory cells MC. These memory cells MC and the selection transistors ST are isolated from each other in the word line WL direction by STI (Shallow Trench Isolation) extending along the bit line BL direction.

Figure 2:
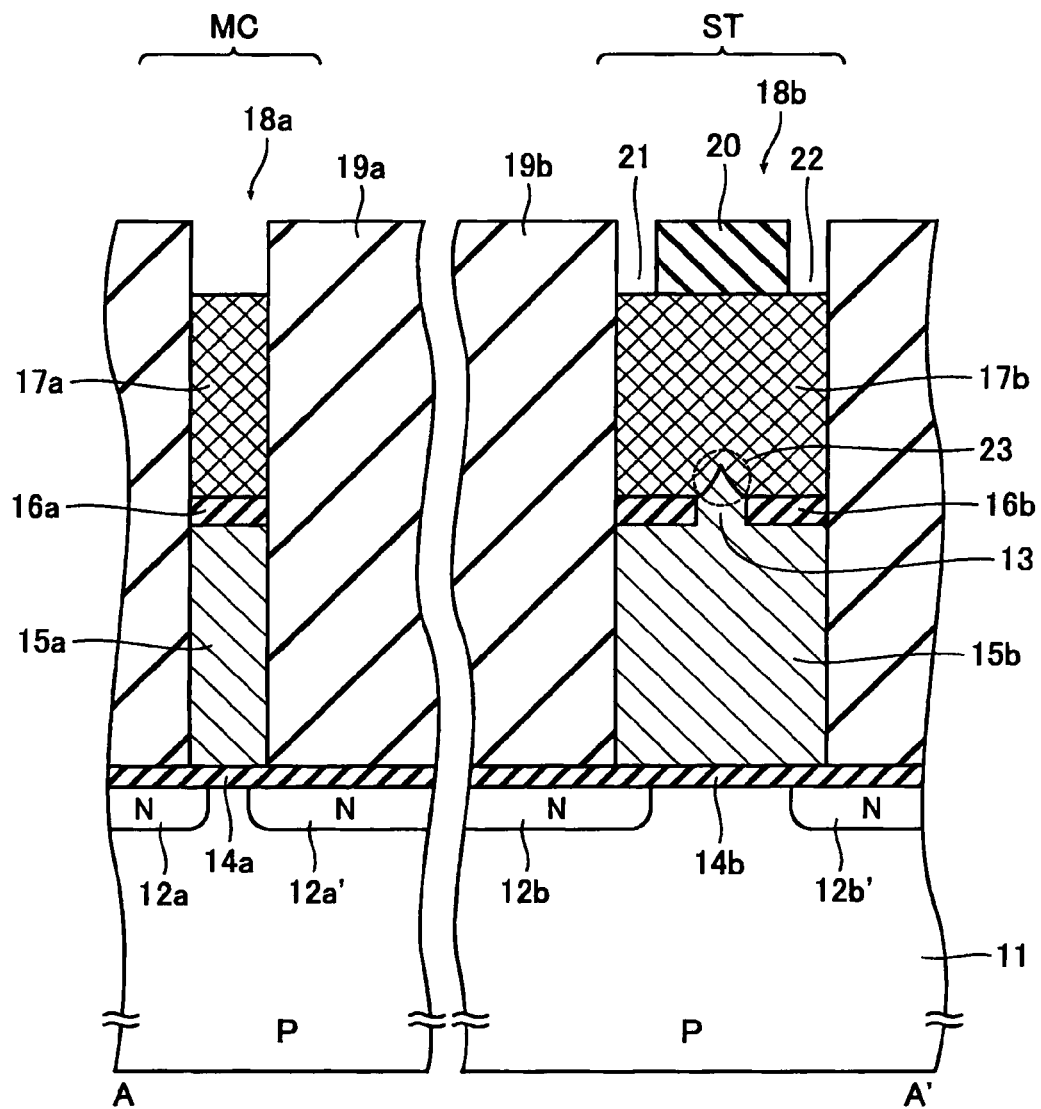
FIG. 2 is a partly omitted view of an A-A' line section of the NAND flash memory according to the embodiment of the present invention.

FIG. 2 shows a partly omitted A-A' line section of the NAND flash memory taken along the bit line BL according to the embodiment of the present invention. The NAND flash memory according to the embodiment comprises the memory cell (MC) and the selection transistor (ST) operative to select or control the memory cell.

A configuration of the memory cell (MC) is described first. The memory cell includes a P-type silicon substrate 11, and a floating gate 15a composed of conductive polysilicon doped with an impurity such as phosphorous (P) and formed on the silicon substrate 11 with a gate insulator 14a composed of silicon oxide interposed. In a memory cell adjacent thereto in the word line (WL) direction (a gate width direction), the surface region of the silicon substrate 11, the gate insulator 14a and a lower portion of the floating gate 15a are isolated from others by STI (not shown).

Deposited on the floating gate 15a and the STI (not shown) is a high-permittivity intergate insulator 16a composed of an ONO ($SiO_2$/SiN/$SiO_2$) film with a thickness of about 10 nm. Formed on the intergate insulator 16a is a control gate 17a, which is silicided after deposition of conductive polysilicon. The control gate 17a has an entirely silicided full silicide structure as described later in detail. The control gate 17a may be composed of a nickel silicide (NiSi), a tungsten silicide (WSi), a cobalt silicide (CoSi) or a titanium silicide (TiSi), formed extending in the word line direction and shared by plural memory cells adjoining in the word line direction. Thus, the control gate 17a is stacked above the floating gate 15a with the intergate insulator 16a interposed to configure a gate electrode 18a having a stacked structure.

The gate electrodes 18a of memory cells adjoining in the bit line (BL) direction (a gate length direction) are isolated from each other by a gate isolation layer 19a composed of silicon oxide. In the present embodiment, the line width of the gate electrode 18a and the width of the gate isolation layer 19a both along the bit line BL direction are formed such that the ratio therebetween, that is, a size ratio of line-and-space becomes almost 1:1 preferably. The size ratio of line-and-space is though not limited to 1:1.

Formed in the upper surface of the P-type silicon substrate 11 are an N-type source diffused region 12a doped with an impurity such as phosphorous (P) and an N-type drain diffused region 12a' doped with an impurity such as phosphorous (P), which are formed sandwiching the gate electrode 18a therebetween in a self-aligned manner. The P-type silicon substrate 11 may be a P-type well instead.

A configuration of the selection transistor (ST) is described next. The selection transistor (ST) includes the P-type silicon substrate 11, and a lower gate 15b composed of conductive polysilicon doped with an impurity such as phosphorous (P) and formed on the P-type silicon substrate 11 with a gate insulator 14b composed of silicon oxide interposed. In a selection transistor adjacent thereto in the word line (WL) direction, the surface region of the silicon substrate 11, the gate insulator 15b and a lower portion of the lower gate 15b are isolated from others by STI (not shown).

Deposited on the lower gate 15b is a high-permittivity intergate insulator 16b composed of an ONO ($SiO_2$/SiN/$SiO_2$) film with a thickness of about 10 nm. Formed through the intergate insulator 16b almost at the central portion in the bit line (BL) direction on the upper surface of the lower gate 15b is an aperture 13. Formed on the intergate insulator 16b is an upper gate 17b, which is silicided after deposition of conductive polysilicon. The upper gate 17b has full silicide portions which are fully silicided in a film thickness range at least at both ends in the bit line BL direction. The upper gate 17b may be composed of a nickel silicide (NiSi), a tungsten silicide (WSi), a cobalt silicide (CoSi) or a titanium silicide (TiSi) formed extending in the word line direction and shared by plural selection transistors adjoining in the word line direction. Thus, the upper gate 17*b* is stacked above the lower gate 15*b* with the intergate insulator 16*b* interposed to configure a gate electrode 18*b* having a stacked structure.

The upper gate 17*b* is electrically connected to the lower gate 15*b* via the above-described aperture 13. A block film 20 composed of silicon oxide is formed on the upper gate 17*b*. The block film 20 is larger than the aperture 13 to cover the entire of the aperture 13 and smaller than the upper gate electrode 17*b* as shown in FIG. 1. The block film 20 is arranged to prevent metal atoms from diffusing into the inside of the lower gate 15*b* through the aperture 13 when the upper gate 17*b* is fully silicided and reaching the gate insulator 14*b*.

The function of the block film 20 is described in more detail. The control gate 17*a* and the upper gate 17*b* can be fully silicided by depositing a film of a metal such as Ni through a process of sputtering, followed by annealing to diffuse metal atoms. Unless the block film 20 is present when Ni is sputtered into the surface of the upper gate 17*b*, Ni atoms deposit over the entire surface of the upper gate 17*b*. Usually, in full siliciding, Ni atoms are sputtered excessively in consideration of variations in reaction. In this case, Ni atoms diffuse into the lower gate 15*b* through the aperture 13, and finally into the gate insulator 14*b*, after the upper gate 17*b* is fully silicided. This results in variations in the characteristics of transistors and deteriorates the reliability of memory elements.

The present embodiment provides the block film 20 on the surface of the upper gate 17*b* to solve the above problem. When Ni is sputtered into the surface of the upper gate 17*b*, Ni atoms are blocked by the block film 20 and allowed to deposit only on portions other than the portion immediately beneath the block film 20. The other portions contain gaps 21, 22 between the block film 20 and a gate isolation layer 19*b* for isolating the gate electrode 18*a* of the memory cell from the gate electrode 18*b* of the selection transistor. Ni atoms deposited on the portions containing the gaps 21, 22 diffuse into the inside of the upper gate 17*b* and silicide the upper gate 17*b*. The distance from the gaps 21, 22 to the aperture 13 is longer than the distance from the gaps 21, 22 to the intergate insulator 16*b*. Therefore, a region 23 almost immediately above the aperture 13 progresses the silicide reaction slower than in other regions. As a result, Ni atoms can be suppressed to diffuse into the lower gate 15*b* through the aperture 13 and prevented from reaching the gate insulator 14*b*.

The width of the block film 20 and the width of the aperture 13 can be designed freely. In order to ensure the contact resistance of the upper gate 17*b* with the lower gate 15*b* sufficiently, it is not preferable to make the size of the aperture 13 too small. The size of the block film 20 can be adjusted to confine the siliciding metal atoms deposited on the upper surface of the upper gate 17*b* to the area set by the gaps 21, 22.

Formed in the upper surface of the P-type silicon substrate 11 are an N-type source diffused region 12*b* doped with an impurity such as phosphorous (P) and an N-type drain diffused region 12*b*' doped with an impurity such as phosphorous (P), which are formed in a self-aligned manner sandwiching the gate electrode 18*b* therebetween. The P-type silicon substrate 11 may be a P-type well instead. A channel region is formed immediately beneath the gate insulator 14*b* between the N-type source diffused region 12*b* and the N-type drain diffused region 12*b*'.

In the NAND flash memory according to the present embodiment, after fully siliciding the control gate 17*a* and the upper gate 17*b*, siliciding of the lower gate 15*b* through the aperture 13 can be prevented from excessively progressing to allow metal atoms to diffuse into the gate insulator 14*b*. As a result, it is possible to provide a NAND flash memory with high reliability.

In the above embodiment the configuration of the selection transistor is described though transistors Tr in peripheral circuits can be configured similarly.

Embodiment of Manufacturing Method

An embodiment associated with a method of manufacturing the above-described NAND flash memory is described in detail with reference to the drawings. FIGS. 3-14 illustrate process steps of manufacturing the NAND flash memory according to the above-described embodiment.

Figure 3:
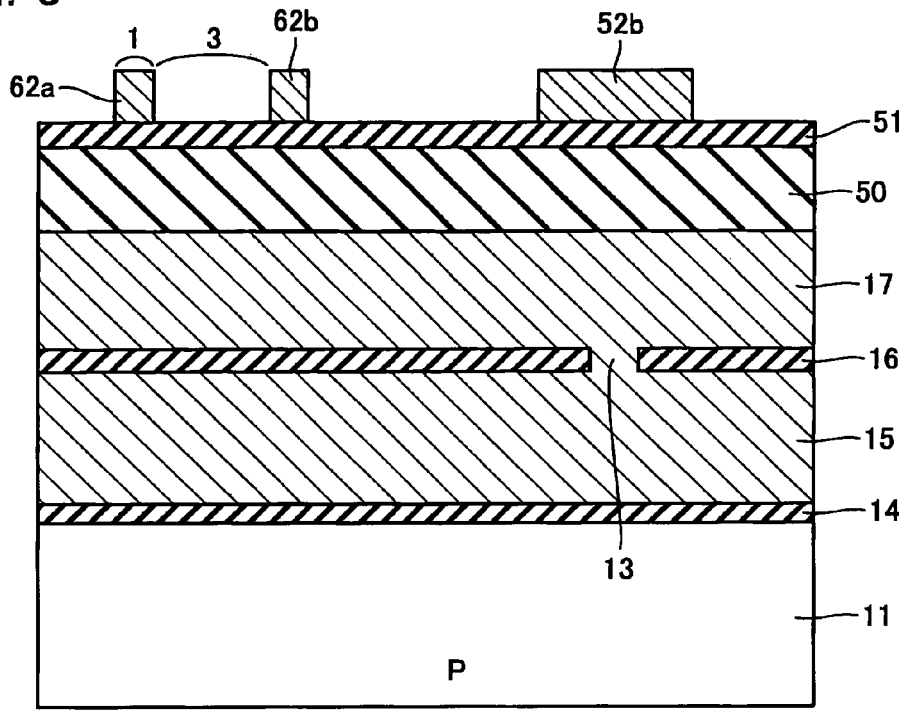
FIG. 3 is an illustrative view of a method of manufacturing the NAND flash memory according to the embodiment of the present invention.

In step 1, the surface of the semiconductor substrate 11 such as a silicon substrate is subjected to thermal oxidation to form the gate insulator 14 composed of silicon oxide with a film thickness of 10 nm as shown in FIG. 3. Then, a process of CVD is applied to deposit a first conductive polysilicon film 15 doped with phosphorous (P) at a certain concentration with a thickness of 10 nm. Although not shown in the figure, STI is used to separate the first polysilicon film 15, the gate insulator 14 and the surface region of the semiconductor substrate 11 into portions in the word line direction.

Then, a process of CVD is applied to deposit the intergate insulator 16 such as an ONO ($SiO_2$/SiN/$SiO_2$) film. Subsequently, the aperture 13 for short-circuiting between the upper gate 17*b* and the lower gate 15*b* of the transistor is patterned and formed in part of the region for use in formation of the selection transistor (ST) (this is similarly applied to the transistors in peripheral circuits).

Thereafter, processes of CVD are applied to sequentially deposit a polysilicon film 17 with a thickness of 100 nm, a silicon oxide film 50 such as a TEOS film with a thickness of 150 nm, and an antireflective film 51.

Subsequently, a spin coating method is used to apply a photoresist over the entire surface, followed by pattering through a photolithography technology to selectively form masks 62*a*, 62*b*, 52*b*. The masks 62*a*, 62*b* in the memory cell area differ in line pattern from the mask 52*b* in the selection transistor area. Namely, the memory cell area includes a line pattern formed with a smaller width than the selection transistor area. The line pattern and the space pattern in the memory cell area have a ratio of almost 1:3. Such the pattern may be formed to have the ratio of almost 1:3 by slimming of the pattern, after forming the line pattern and the space pattern having a ratio of almost 1:1 in the memory cell area.

Figure 4:
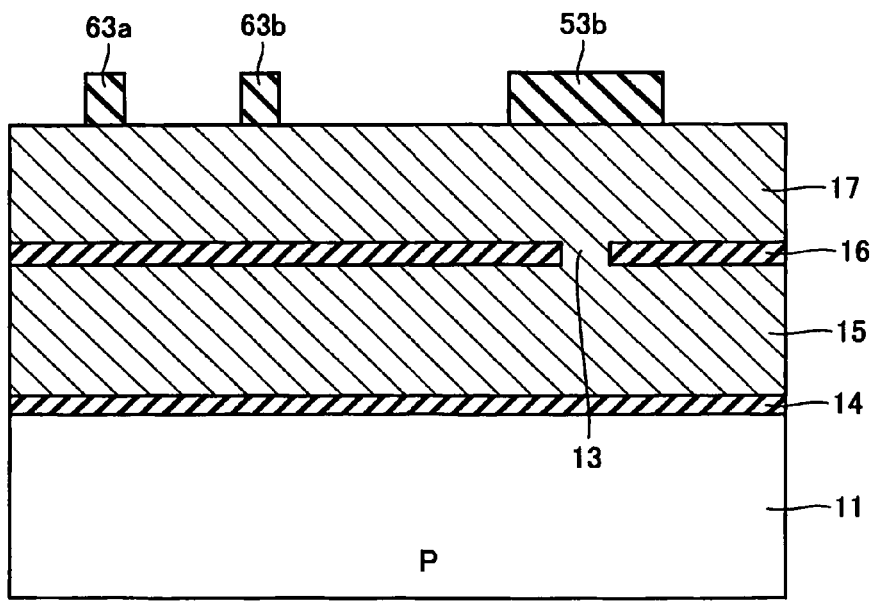
FIG. 4 is an illustrative view of the method of manufacturing the NAND flash memory according to the embodiment of the present invention.

In step 2, an anisotropic etching such as RIE is applied to selectively remove the antireflective film 51 and the silicon oxide film 50. Then, ashing and wet etching are applied to remove the masks 62*a*, 62*b*, 52*b* and the antireflective film 51 to form hard masks 63*a*, 63*b*, 53*b* as shown in FIG. 4.

Figure 5:
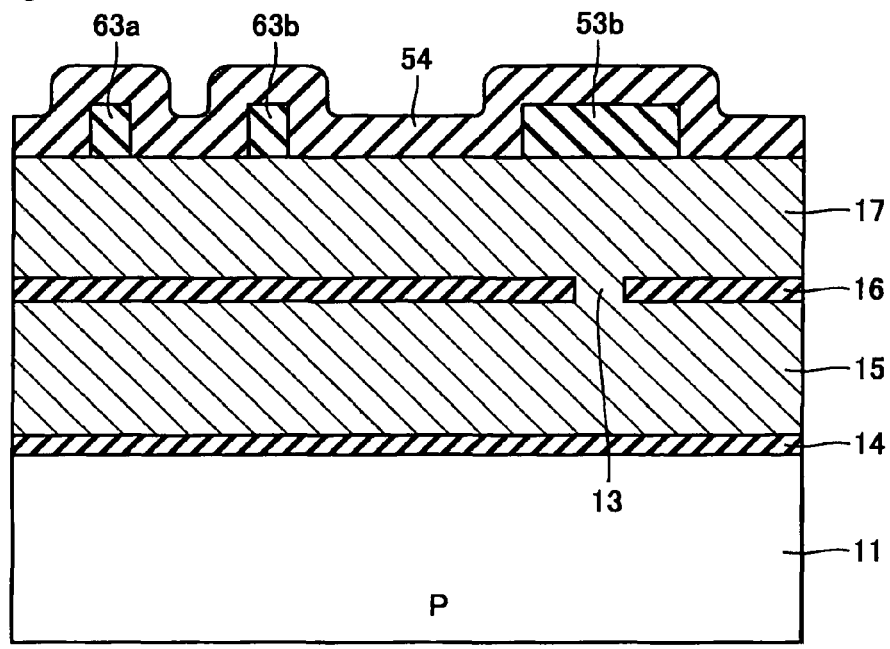
FIG. 5 is an illustrative view of the method of manufacturing the NAND flash memory according to the embodiment of the present invention.

In step 3, a process of plasma CVD is applied to deposit a silicon nitride 54 over the entire surface as shown in FIG. 5. The film thickness of the deposited silicon nitride 54 is set almost equal to the line size of the patterned hard masks 63*a*, 63*b*.

Figure 6:
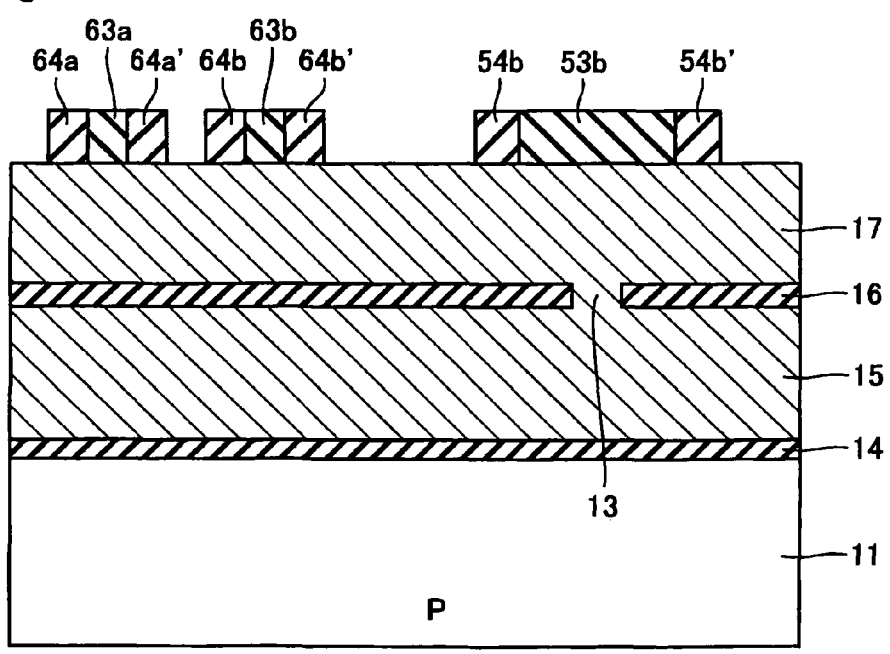
FIG. 6 is an illustrative view of the method of manufacturing the NAND flash memory according to the embodiment of the present invention.

In step 4, a dry etching such as RIE is applied to etch back the silicon nitride 54 to form sidewalls 64*a*, 64*a*', 64*b*, 64*b*', 54*b*, 54*b*' on the sides of the hard masks 63*a*, 63*b*, 53*b* as shown in FIG. 6. The lateral thickness of the sidewalls 64*a*, 64*a*', 64*b*, 64*b*', 54*b*, 54*b*' becomes almost equal to the line width of the hard masks 63*a*, 63*b*. The lateral thickness of the sidewalls 64*a*, 64*a*', 64*b*, 64*b*', 54*b*, 54*b*' can be controlled by the film thickness of the deposited silicon nitride 54.

Figure 7:
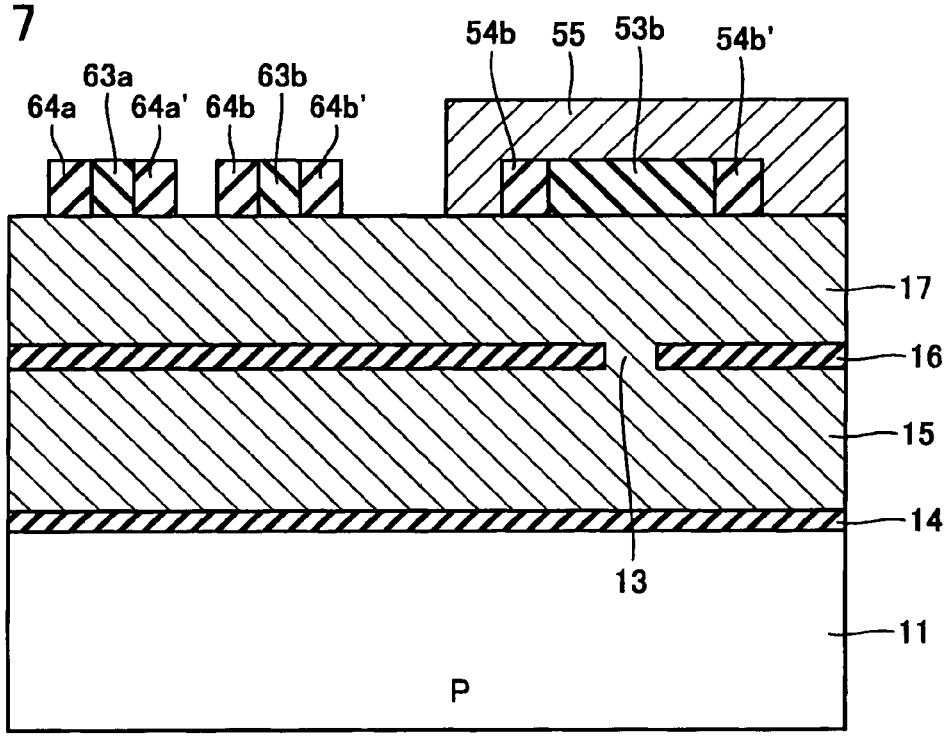
FIG. 7 is an illustrative view of the method of manufacturing the NAND flash memory according to the embodiment of the present invention.

In step 5, a resist is applied over the entire surface and a photolithography technology is used to form a mask 55 for covering the region for use in formation of the transistor as shown in FIG. 7.

Figure 8:
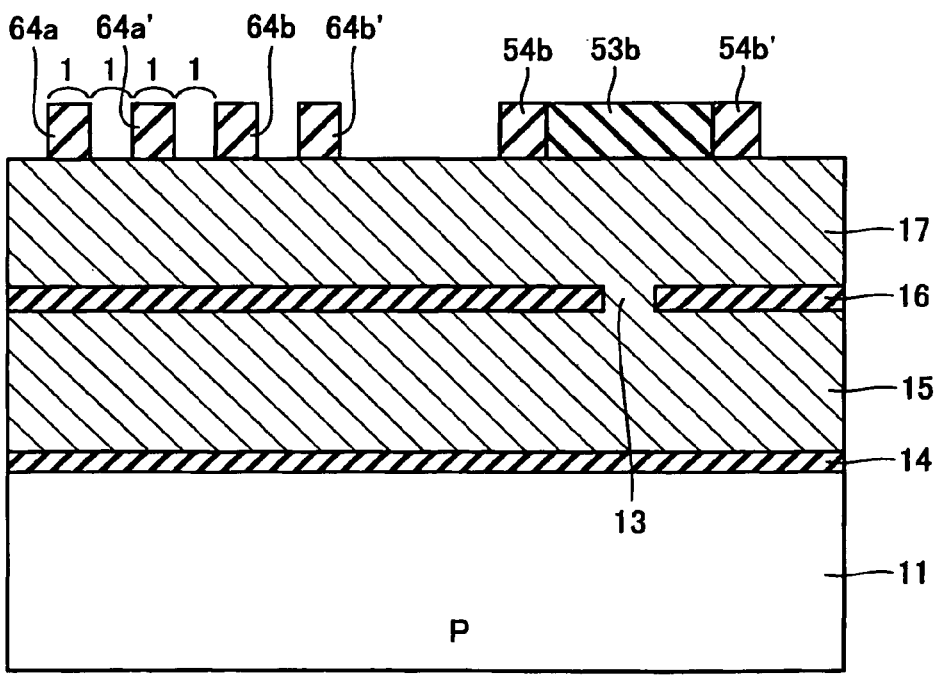
FIG. 8 is an illustrative view of the method of manufacturing the NAND flash memory according to the embodiment of the present invention.

In step 6, a wet etching with DHF (dilute hydrofluoric acid) is applied to remove the hard masks 63a, 63b from the memory cell area as shown in FIG. 8. Then, ashing and wet etching are applied to remove the mask 55. The remaining sidewalls 64a, 64a', 64b, 64b' are used to form gate patterns at a smaller pattern pitch than the pattern pitch of the line patterns in the hard masks 63a, 63b. In this case, the line pattern (gate pattern) and the space pattern have a ratio of about 1:1.

Figure 9:
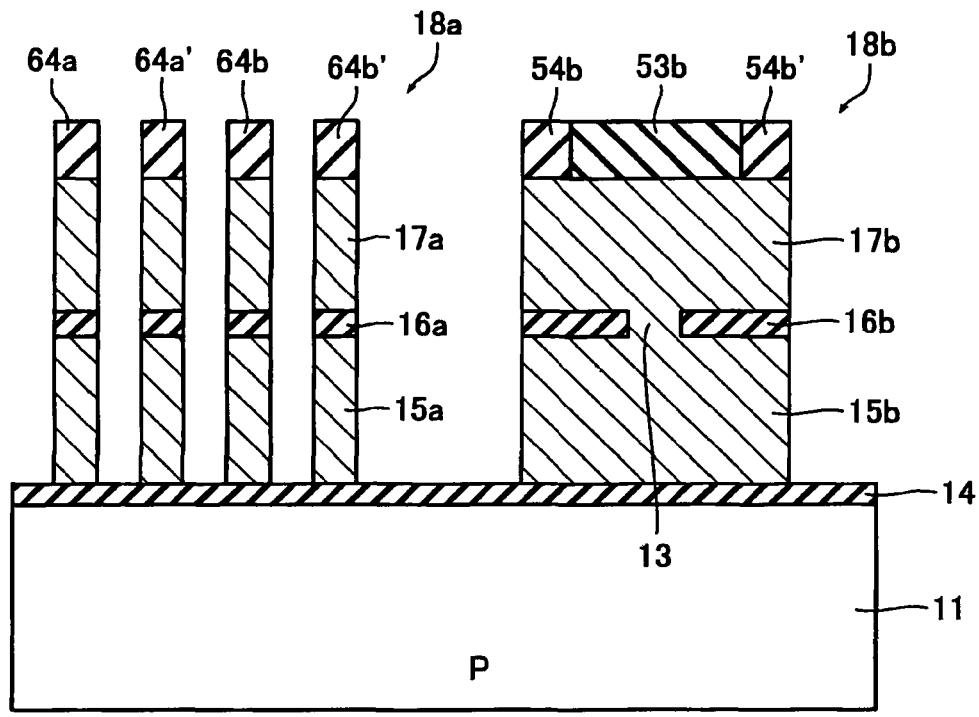
FIG. 9 is an illustrative view of the method of manufacturing the NAND flash memory according to the embodiment of the present invention.

In step 7, the hard mask 53b and the sidewalls 64a, 69a', 64b, 64b', 54b, 54b' are used as an etching mask for anisotropic etching such as RIE to form the gate electrode 18a of the memory cell and the gate electrode 18b of the selection transistor as shown in FIG. 9.

Figure 10:
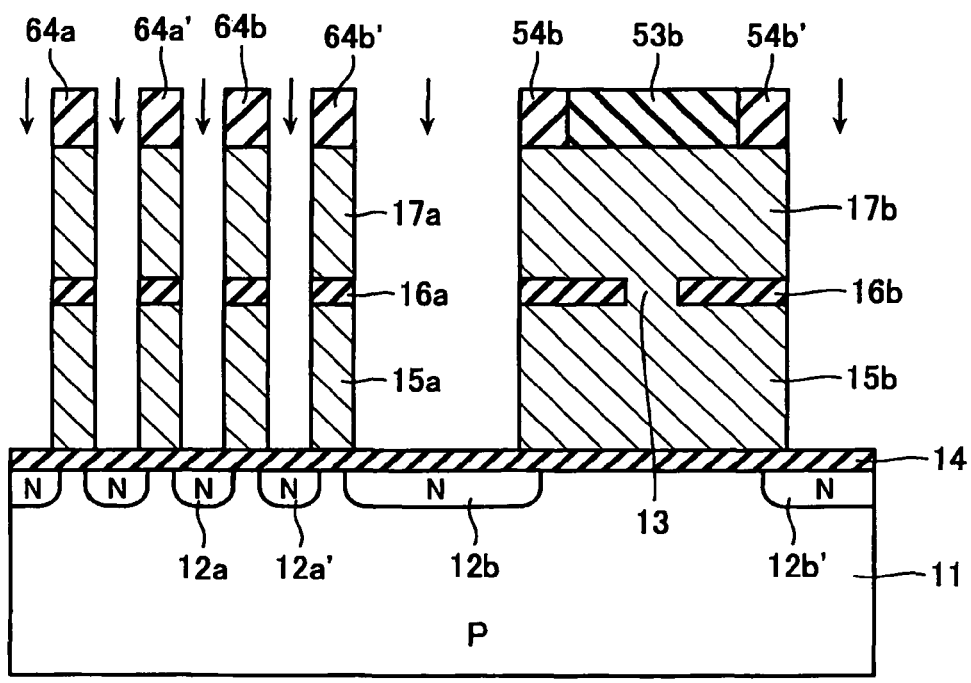
FIG. 10 is an illustrative view of the method of manufacturing the NAND flash memory according to the embodiment of the present invention.

In step 8, ions of phosphorous (P) are implanted at a concentration of $1 \times 10^{18}$ cm$^{-3}$ to form N-type source regions 12a, 12b and N-type drain regions 12a' and 12b' as shown in FIG. 10. In this case, the sidewalls 64a, 64a', 64b, 64b', 54b, 54b' serve as masks together with the hard mask 53b to form respective diffused regions in a self-aligned manner.

Figure 11:
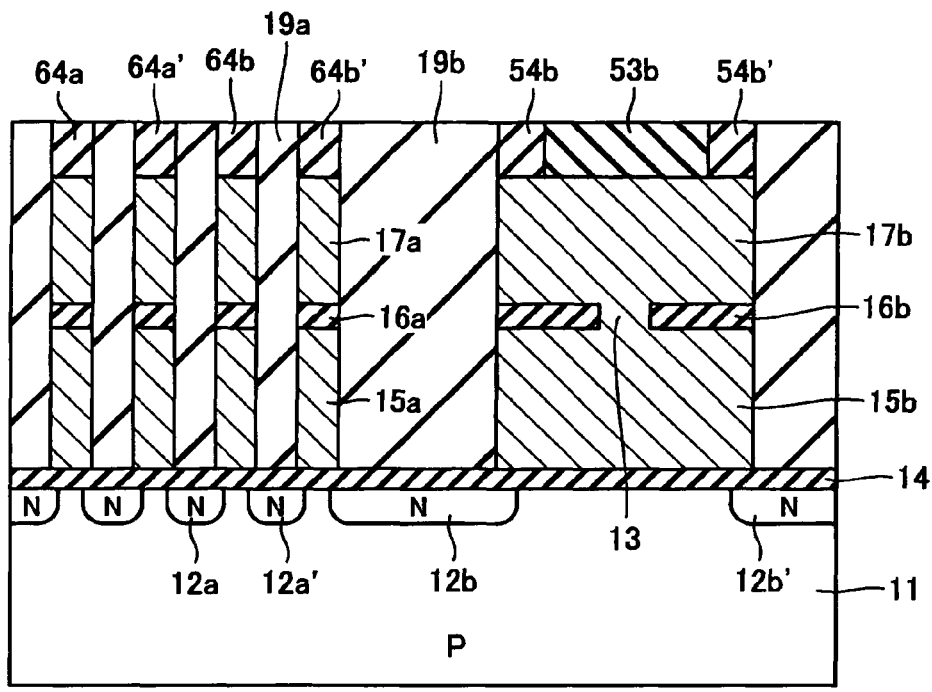
FIG. 11 is an illustrative view of the method of manufacturing the NAND flash memory according to the embodiment of the present invention.

In step 9, a process of plasma CVD is applied to deposit an interlayer insulator such as a TEOS film over the entire surface, which is buried between the gate electrode 18a and the gate electrode 18b as shown in FIG. 11. Then, a process of CMP is applied to planarize the surface to form the gate isolation layer portions 19a, 19b. In this case, the sidewalls 64a, 64a', 64b, 64b', 54b, 54b' serve as stopper films. The gate isolation layer portion 19a electrically separates the gate electrodes 18a of the memory cells from each other. The gate isolation layer portion 19b electrically separates the gate electrode 18a of the memory cell from the gate electrode 18b of the selection transistor.

Figure 12:
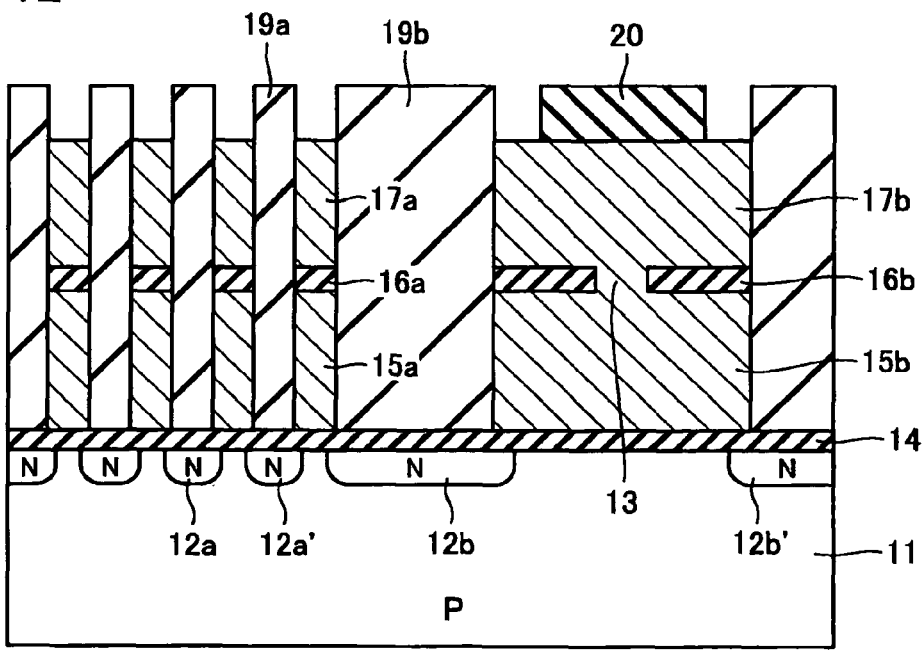
FIG. 12 is an illustrative view of the method of manufacturing the NAND flash memory according to the embodiment of the present invention.

In step 10, a process of RIE with CH$_3$F gas or a wet etching with phosphoric acid is applied to remove the sidewalls 64a, 64a', 64b, 64b', 54b, 54b' as shown in FIG. 12, thus forming the block film 20.

Figure 13:
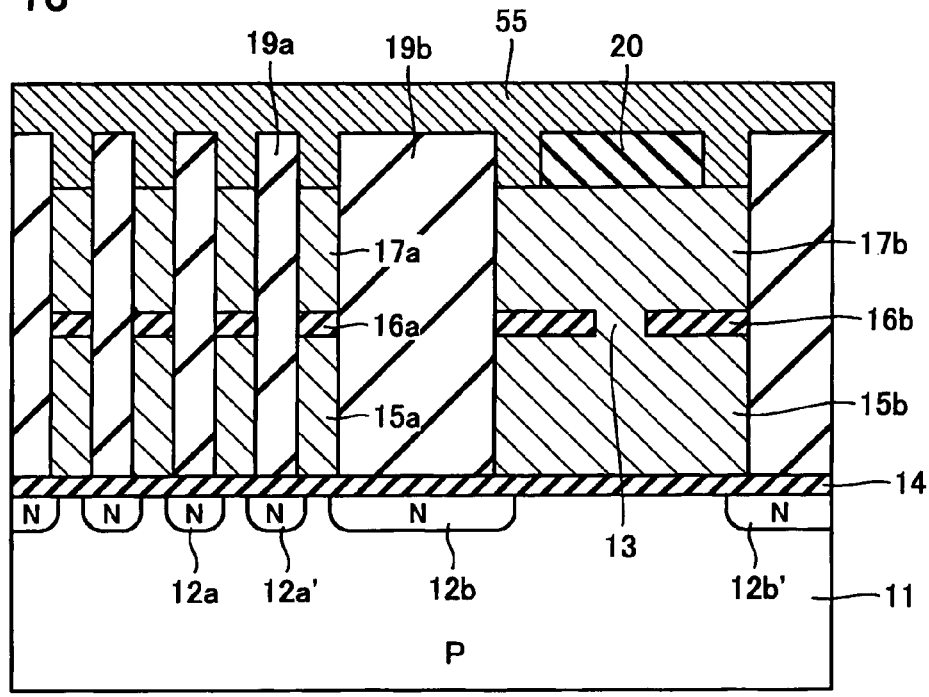
FIG. 13 is an illustrative view of the method of manufacturing the NAND flash memory according to the embodiment of the present invention.

In step 11, a sputtering method is used to deposit atoms 55 of a metal such as Ni over the entire surface as shown in FIG. 13.

Figure 14:
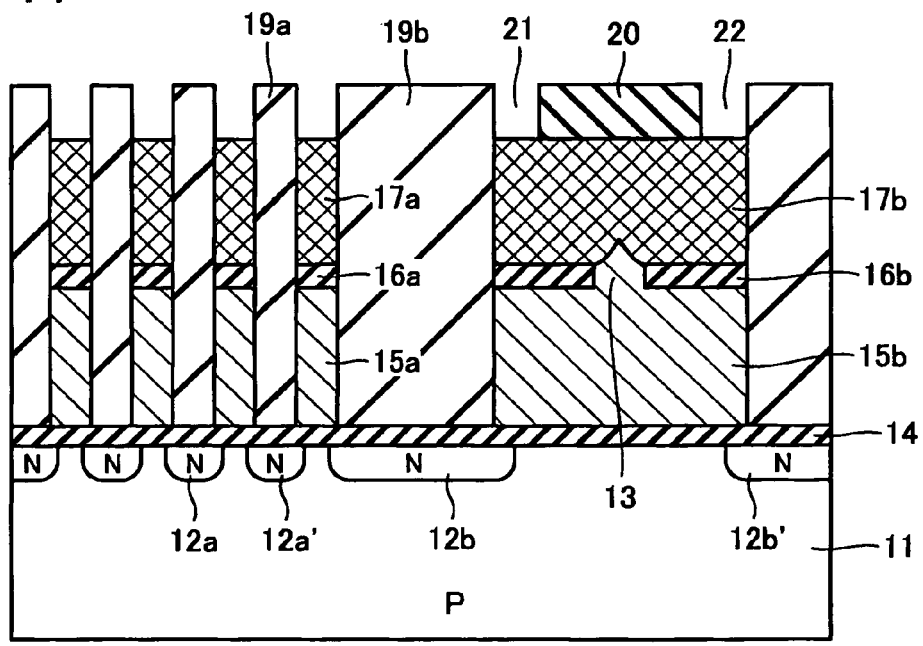
FIG. 14 is an illustrative view of the method of manufacturing the NAND flash memory according to the embodiment of the present invention.

Finally, in step 12, an annealing process is applied to react Ni with polysilicon in the control gate 17a and the upper gate 17b to form nickel silicide, thereby fully siliciding the control gate 17a and the upper gate 17b as shown in FIG. 14. The method of siliciding is not limited to this example.

In full siliciding, the block film 20 formed on the surface of the upper gate 17b blocks the deposition of Ni atoms on the surface at the center of the upper gate 17b. Therefore, Ni atoms are allowed to deposit only on the portions in the gaps 21, 22 between the block film 20 and the gate isolation layer portion 19b. Ni atoms diffused into the upper gate 17b by annealing take a longer time to reach near the aperture 13 than other regions because the distance to the aperture 13 is longer. As a result, Ni atoms can be prevented from diffusing into the inside of the lower gate 15b through the aperture 13.

In accordance with the method of manufacturing semiconductor memory devices according to the present embodiment, metal atoms can be prevented from diffusing into the gate insulator even if the upper gate of the transistor is fully silicided. As a result, it is possible to ensure stable operation of transistors.

In accordance with the method of manufacturing semiconductor memory devices according to the present embodiment, the sidewalls 64a, 64a', 64b, 64b' are formed on both sides of the hard masks 63a, 63b to form memory cells MC with a mask of the sidewalls. Accordingly, fine patterning beyond the exposure resolution limit for hard mask formation can be achieved easily and thus can realize high integration.

[Others]

The embodiments of the invention have been described above though the present invention is not limited to these embodiments but rather can be given various modifications and additions without departing from the scope and spirit of the invention. For example, the NAND flash memory is described in the above embodiments though the present invention is also applicable to other stacked-gate nonvolatile memories such as a NOR flash memory.

What is claimed is:

1. A method of manufacturing a semiconductor memory device, comprising:
    forming a gate insulator on a semiconductor substrate;
    forming a first conductive film on said gate insulator;
    forming an intergate insulator on said first conductive film;
    selectively forming an aperture by etching through said intergate insulator in part of a region for use in formation of a transistor;
    forming a second conductive film on said intergate insulator;
    forming a first insulator above said second conductive film;
    forming a block film larger than said aperture to cover said aperture by selectively removing part of said first insulator;
    forming a sidewall composed of a second insulator on the sides of said block film and forming a gate pattern composed of said second insulator in a region for use in formation of control gates of memory cells;
    selectively removing said second conductive film, said intergate insulator and said first conductive film by etching with a mask of said block film, said sidewall and said gate pattern to form gates of said memory cell and said transistor;
    burying a third insulator around said formed gates;
    removing said second insulator after burying said third insulator; and
    siliciding said second conductive film by depositing a siliciding metal on an upper surface of a portion of the gates of said memory cell and said transistor from which said second insulator has been removed.

2. The method of manufacturing a semiconductor memory device according to claim 1, further comprising forming a line pattern composed of said first insulator at a position between gates of said memory cells together with the step of forming a block film,
    wherein forming a sidewall and a gate pattern includes depositing said second insulator on said block film and said line pattern, then etching back said deposited second insulator, and selectively removing said first insulator from a region for use in formation of said memory cells, thereby forming said gate pattern having a smaller pattern pitch than the pattern pitch of said line pattern of said first insulator.

3. The method of manufacturing a semiconductor memory device according to claim 2, wherein forming a line pattern includes forming said line pattern with a ratio of about 1:3 between said line pattern and a space pattern between said line patterns, and
    forming a gate pattern includes forming said gate pattern on the side wall of said line pattern with a ratio of about 1:1 between said gate pattern measurement and said line pattern measurement.

4. The method of manufacturing a semiconductor memory device according to claim 1, wherein said siliciding metal is nickel, tungsten, cobalt or titanium.

5. The method of manufacturing a semiconductor memory device according to claim 1, wherein siliciding said second conductive film includes siliciding entirely said second conductive film of said memory cells.

6. The method of manufacturing a semiconductor memory device according to claim 1, wherein said first insulator is silicon oxide and said second insulator is silicon nitride.

* * * * *